US007269401B2

(12) United States Patent
Saito et al.

(10) Patent No.: US 7,269,401 B2
(45) Date of Patent: Sep. 11, 2007

(54) SIGNAL PROCESSING CIRCUIT FOR TUNER WHICH APPLIES SIGNAL PROCESSING BASED ON VARIATION IN FREQUENCY OF INTERMEDIATE FREQUENCY SIGNAL

(75) Inventors: Yasuji Saito, Gunma-ken (JP); Masaaki Taira, Akashi (JP); Yutaka Hirakoso, Koga (JP)

(73) Assignee: Sanyo Electric Co., Ltd., Osaka (JP)

( * ) Notice: Subject to any disclaimer, the term of this patent is extended or adjusted under 35 U.S.C. 154(b) by 369 days.

(21) Appl. No.: 10/927,793

(22) Filed: Aug. 27, 2004

(65) Prior Publication Data

US 2005/0059368 A1 Mar. 17, 2005

(30) Foreign Application Priority Data

Aug. 28, 2003 (JP) ............................ 2003-304953

(51) Int. Cl.
*H04B 1/06* (2006.01)
*H04B 7/00* (2006.01)

(52) U.S. Cl. ....................... 455/230; 455/266; 455/315

(58) Field of Classification Search ...... 455/3.01–3.02, 455/142, 230, 266, 313–315, 323, 339–340; 348/731

See application file for complete search history.

(56) References Cited

U.S. PATENT DOCUMENTS 5,493,710 A 2/1996 Takahara et al.
5,630,215 A * 5/1997 Waldie et al. ........... 455/192.2
2005/0260964 A1* 11/2005 Wagner ................... 455/253.2
2006/0003718 A1* 1/2006 Oohata et al. ........... 455/186.1

FOREIGN PATENT DOCUMENTS

JP 7-22975 1/1995

OTHER PUBLICATIONS

English Patent Abstract for 7-22975 from esp@cenet, published Jan. 24, 1995.
Korean Office Action dated Apr. 28, 2006 issued in Korean Patent Application No. 10-2004-67798, with English translation, 3 pages.
English Patent Abstract for 7-22975 from esp@cenet, published Jan. 24, 1995.

* cited by examiner

*Primary Examiner*—Nguyen T. Vo
(74) *Attorney, Agent, or Firm*—Osha Liang LLP

(57) ABSTRACT

A signal processing circuit for a tuner has a detector band pass filter for extracting a carrier of an intermediate frequency signal, a frequency counter for counting, based on a clock signal, a frequency of a carrier of the intermediate frequency signal which passes through the detector band pass filter, and an intermediate frequency variation signal outputting section for outputting an intermediate frequency variation signal based on a difference between the counted frequency and a frequency of the clock signal. Based on the intermediate frequency variation signal, a frequency selection characteristic of an intermediate frequency band pass filter, a signal detector, an adjacent interference detector, or an S-meter-band pass filter are controlled. In this manner, even when a carrier frequency of an intermediate frequency signal input from a tuner varies, the frequency selection characteristic of the intermediate frequency band pass filter, signal detector, adjacent interference detector, and S-meter-band pass filter can be suitably controlled.

12 Claims, 2 Drawing Sheets

SIGNAL PROCESSING CIRCUIT FOR TUNER WHICH APPLIES SIGNAL PROCESSING BASED ON VARIATION IN FREQUENCY OF INTERMEDIATE FREQUENCY SIGNAL

CROSS-REFERENCE TO RELATED APPLICATIONS

The priority Japanese Patent Application Number 2003-304953 upon which this patent application is based is hereby incorporated by reference.

BACKGROUND OF THE INVENTION

1. Field of the Invention

The present invention relates to a signal processing circuit for a tuner, and in particular to a signal processing circuit for a tuner which applies signal processing based on a frequency variation when a carrier frequency of an input intermediate frequency ("IF") signal is varied.

2. Description of the Related Art

An AM (amplitude modulation) system is used for transmitting a signal to be transmitted (modulating signal) on an amplitude of a signal (carrier) having a frequency which can be radiated from a broadcasting station and is primarily used in medium frequency radio broadcasting (526.5 kHz–1606.5 kHz). Radio waves in a medium frequency radio broadcasting frequency band have a characteristic that a wide service area can be secured and it is possible to provide a stable service for a moving body such as a car, because these radio waves are not only transmitted as ground wave but also transmit as space waves reflected by the ionosphere (E layer) around a height of 100 km above the ground, particularly during night time.

A superheterodyne detection method is typically used in a receiver device for receiving an AM signal. In a superheterodyne detection method, a signal from a broadcasting station and a signal from an oscillator circuit (local oscillator circuit) provided in the receiver device are synthesized, a beat between the two synthesized signals is detected and converted to an intermediate frequency signal, and the intermediate frequency signal is amplified and demodulated. The superheterodyne detection method has characteristics that a high amplification gain can be easily obtained and crosstalk can be easily prevented. In addition, it is necessary to provide a band pass filter for allowing only a desired broadcasting frequency in the receiver circuit for receiving an AM signal. Because it is very difficult to continuously change the center frequency of a band pass filter without changing the band characteristics of the filter, a method is employed in which the local oscillation frequency is changed to allow only a signal of an intermediate frequency converted to a predetermined frequency to pass through.

In a receiver device for receiving an AM signal, the level of a detected signal which is an audio signal to be output varies, or crosstalk tends to occur depending on the intensity of an electric field of a received broadcasting wave input from an antenna.

As a method for reducing the occurrence of crosstalk, a method is proposed for changing the sensitivity of an automatic gain control (AGC) circuit for amplifying the received RF signal based on the intensity of electric field of a received broadcasting wave (for example, in Japanese Patent Laid-Open Publication No. Hei 7-22975).

With advances in digital signal processing techniques, a signal processing circuit for a tuner has been realized in which an intermediate frequency signal is converted into a digital signal by an analog-to-digital converter (ADC), the intermediate frequency signal is detected through digital signal processing, and a demodulated signal is obtained.

A carrier frequency of an intermediate frequency signal which is a signal from an AM tuner is typically 450 kHz. The intermediate frequency signal is obtained by tuning a frequency of a local oscillator in the tuner based on a frequency of a broadcast wave of a desired station. In the local oscillator for obtaining an intermediate frequency of 450 kHz from a carrier of a broadcasting wave of a medium frequency band, typically, a quartz resonator of 10.25 MHz is used. This frequency is determined by the fact that the frequency spacing in medium frequency broadcasting is 9 kHz.

Digital audio devices other than the tuner such as, for example, a compact disk player (CDP) and a minidisk player (MDP), on the other hand, typically operate based on a quartz oscillator of 16.9344 MHz. Because of this, it is possible to use the clock frequency of a tuner DSP (digital signal processor) common to other digital audio devices so that the development cost of a circuit and software for digital signal processing can be reduced.

In addition, a signal processing circuit for a tuner may also receive digital input from devices other than a tuner such as, for example, a digital audio device such as a CDP and MDP and apply signal processing such as sound quality correction within a single chip. In this configuration, because provision of two types of different clock frequencies would increase the cost, the signal processing circuit for the tuner also is required to operate with a common reference clock frequency.

Therefore, in general, a signal processing circuit for a tuner and the tuner itself operate based on separate and independent frequencies of quartz resonators. In an actual product, these frequencies may be different because of individual differences of the quartz resonator, environmental temperature, etc.

In a detection process in a signal processing circuit for a tuner, the variation of carrier frequency of an input intermediate frequency signal with respect to a clock frequency of the signal processing circuit for a tuner can cause increase in degradation of SN ratio of the demodulated signal and degradation of adjacent interference detection precision.

SUMMARY OF THE INVENTION

An advantage of the present invention is that, in a signal processing circuit for a tuner, a variation in a carrier frequency of an intermediate frequency signal input from a tuner is detected and a frequency filter for signal processing can be suitably controlled based on an amount of the variation.

According to one aspect of the present invention, there is provided a signal processing circuit for a tuner which receives an input of an intermediate frequency (IF) signal produced by mixing a received broadcasting signal and a local oscillator frequency signal produce by a first local oscillator and detects and demodulates the IF signal, the signal processing circuit comprising a signal detector, which operates based on a clock signal produced by a second local oscillator, for detecting the intermediate frequency signal; and a frequency variation detector for detecting a difference in frequency between a carrier of the IF signal and the clock signal and for outputting the IF variation signal, wherein the frequency variation detector comprises a detector band pass filter (BPF) for extracting a carrier of the IF signal, a frequency counter for counting, based on the clock signal, a frequency of the carrier of the IF signal which is passed through the detector BPF, and an IF variation signal outputting section for outputting an IF variation signal based on a difference between the counted frequency and a frequency of the clock signal, and a frequency selection characteristic in an operation of the signal processing circuit for a tuner is controlled based on the IF variation signal.

With this structure, even when the carrier frequency of the IF signal varies, the frequency selection characteristic of the frequency filter in the signal processing circuit for a tuner can be optimally controlled according to the amount of variation, and it is possible to inhibit degradation of sound quality of the demodulated signal.

BRIEF DESCRIPTION OF THE DRAWINGS

Preferred embodiment of the present invention will be described in detail based on the following figures, wherein.

DESCRIPTION OF PREFERRED EMBODIMENT

Figure 1:
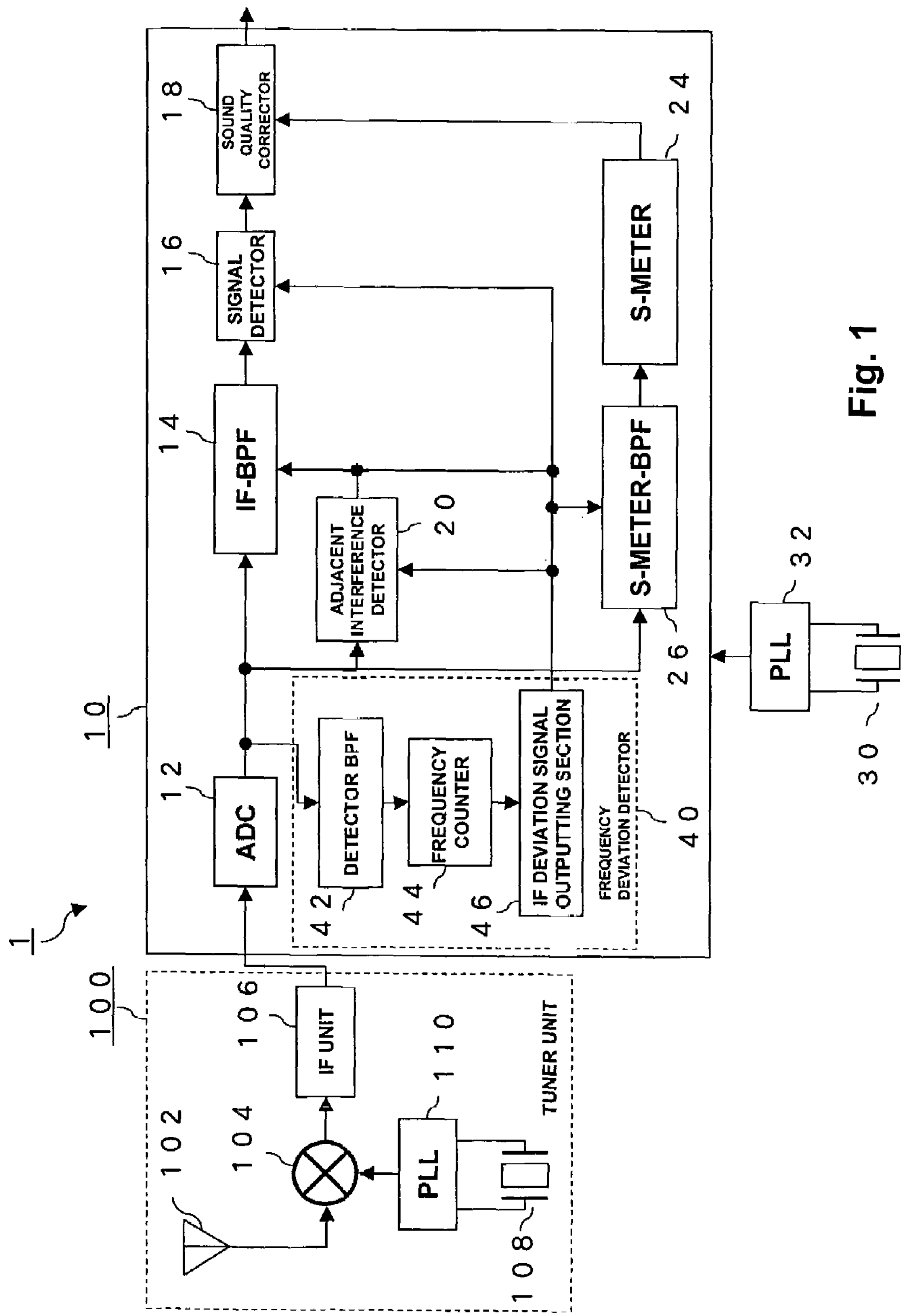
FIG. 1 is a diagram showing a structure of an AM receiver circuit including a signal processing circuit for tuner according to a preferred embodiment of the present invention.

A preferred embodiment of the present invention will now be described referring to the drawings.

FIG. 1 is a diagram showing a structure of an AM receiver circuit 1 including a signal processing circuit for a tuner according to a preferred embodiment of the present invention.

An AM receiver circuit 1 can be primarily separated into two sections including a tuner unit 100 for receiving a broadcasting radio wave and outputting an intermediate frequency (IF) signal, and a tuner digital signal processor (DSP) 10 which is a signal processing circuit for a tuner which receives the IF signal.

The tuner unit 100 comprises an antenna 102 for receiving broadcast radio waves, a mixer 104 for converting a broadcast signal of a desired station into an intermediate frequency (IF) signal having a carrier frequency of 450 kHz, and an IF unit 106 for amplifying an IF signal output from the mixer 104. A local oscillator signal from a local oscillator which allows tuning to an oscillation frequency is input to the mixer 104 in order to convert a carrier frequency of a broadcast signal of a desired station into an IF signal carrier frequency (450 kHz). The local oscillator comprises a first quartz resonator 108 having an intrinsic frequency of 10.25 MHz and a first PLL (phase-locked loop) 110.

In the above description, the carrier frequency of the IF signal is set to 450 kHz, but when a part of the circuit is used in common with an FM tuner, it is possible to temporarily convert the carrier frequency to an increased frequency of 10.7 MHz to match the carrier frequency with the IF signal of the FM tuner.

The tuner DSP 10 receives an IF signal output from the tuner unit 100, converts the IF signal into a digital signal using an analog-to-digital converter (ADC) 12, and demodulates the digital signal using the signal detector 16. The demodulated audio signal is preferably corrected to a sound quality which can be easily heard, by a sound quality corrector 18 based on an intensity of an electrical field of a received broadcasting wave or the like.

The tuner DSP 10 operates based on a clock signal. The clock signal is created by a second quartz resonator 30 having an intrinsic frequency of 16.9344 MHz and a second PLL 32. The ADC 12 converts the input analog IF signal into a digital signal based on the clock signal.

In the present invention, the tuner DSP 10 has a frequency variation detector 40 for detecting a variation of carrier frequency of the IF signal and applies control to a frequency filter for signal processing by the tuner DSP 10 based on a detected amount of frequency variation. This control may be applied in proportion to the IF variation signal or by employing a structure in which a plurality of filters having different characteristics are provided in advance and switched.

The frequency variation detector 40 receives a digital signal from the ADC 12 and extracts a frequency band near a center frequency of the IF signal carrier using a detector band pass filter (BPF) 42. Then, a frequency counter 44 counts the frequency of the IF signal carrier based on the clock signal. The frequency counter 44 counts a number of clock signals (for example, number of rising edges) input between a zero-cross point and a next zero-cross point of the IF signal carrier. Alternatively, it is also possible to count the time from one zero-cross point to the next zero-cross point or to count time from one zero-cross point to another zero-cross point which is two or more zero-cross points later. An IF variation signal outputting section 46 compares the count result with a set value which is stored in advance and outputs the difference as the IF variation signal. More specifically, because the frequency of the clock signal is 16.9344 MHz, when the IF signal is counted based on the clock signal, the count result is uniquely determined. The IF variation signal outputting section 46 stores, as a set value, a value determined in this way for a configuration in which the IF frequency is a predetermined frequency (450 kHz), and creates an IF variation signal by subtracting the set value from the actual count value. In the tuner DSP 10, each of these functions may be realized with hardware blocks or with software.

The tuner DSP 10 controls the frequency selection characteristic related to the operation of the DSP based on the IF variation signal.

With this structure, even when the carrier frequency of the IF signal varies, the frequency selection characteristic of the frequency filter in the tuner DSP can be optimally controlled based on the amount of variation. Therefore, it is possible to inhibit degradation of sound quality of the demodulated signal.

When the tuner DSP 10 has the IF-BPF 14 between the ADC 12 and the signal detector 16, in order to extract a carrier frequency of the IF signal, for example, the frequency selection characteristic related to the operation of the tuner DSP 10 is a center frequency or a selection frequency bandwidth of the IF-BPF 14. In general, the IF-BPF 14 extracts a double side band (DSB) signal which sets the frequency bandwidth to 450 kHz±7.5 kHz. Here, when adjacent interference is strong, there may be cases where a signal is detected from a single side band (SSB) signal. In this case, control is applied in which the frequency selection range of the IF-BPF 14 is set to (450−7.5) kHz−450 kHz or 450 kHz−(450+7.5) kHz.

When the carrier frequency of the IF signal varies, the IF-BPF 14 receives the varied IF signal and the center frequency or frequency bandwidth of the IF BPF is controlled based on the amount of the IF variation.

With this structure, even when a carrier frequency of the IF signal varies, it is possible to remove signals other than the desired broadcast signal. Therefore, it is possible to inhibit degradation of reception gain of a broadcast wave, selectivity, and interference removal characteristics.

When the tuner DSP 10 has an adjacent interference detector 20 for detecting adjacent interference from the output of the ADC 12, for example, the frequency selection characteristic related to the operation of the tuner DSP 10 is a detection frequency range of the adjacent interference detector.

Adjacent interference information detected by the adjacent interference detector 20 is input to the IF-BPF 14 and the IF-BPF 14 controls the IF-BPF characteristic based on the adjacent interference information.

When the carrier frequency of the IF signal varies, the adjacent interference detector 20 receives the IF variation signal and allows the frequency range detected as adjacent interference to follow the IF carrier frequency.

With this structure, even when the carrier frequency of the IF signal varies, it is possible to detect adjacent interference signals with high precision and to apply a much better process to remove adjacent interference.

Figure 2:
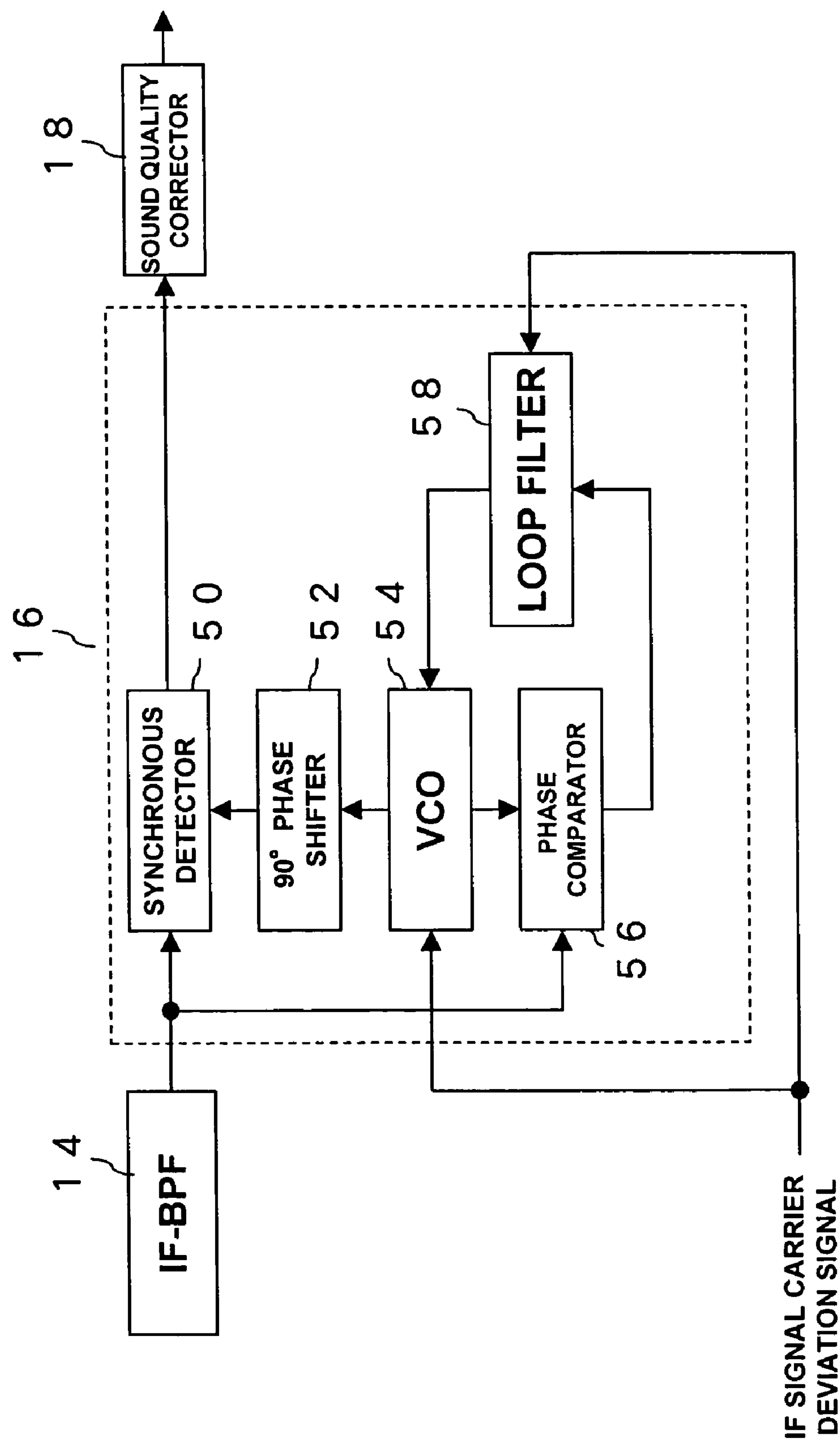
FIG. 2 is a diagram showing a structure of an AM detector using a PLL.

When the signal detector 16 is a synchronous detector using a phase-locked loop (PLL) as shown in FIG. 2, for example, the frequency selection characteristic related to the operation of the tuner DSP 10 is a frequency characteristic of a loop filter and a voltage controlled oscillator (VCO) of the PLL.

A method of synchronous detection will now be described referring to FIG. 2. The IF signal output from the IF-BPF 14 is input to a synchronous detector 50 and to a phase comparator 56. The phase comparator 56 forms a PLL with a VCO 54 and a loop filter 58, and the PLL creates, together with a 90° phase shifter 52, a signal having a phase which is 90° different from that of the carrier of the input IF signal. The synchronous detector 50 detects synchronization from the IF signal and the signal having a phase which is 90° different from that of the carrier of the input IF signal and demodulates the IF signal.

When the carrier frequency varies, the PLL loop filter 58 and the VCO 54 of the detector 16 receive the IF variation signal and the frequency characteristics of the PLL loop filter 58 and of the VCO 54 are changed.

With this structure, even when the carrier frequency of the IF signal varies, it is possible to prevent degradation of characteristics for creating a signal synchronized with the carrier and to prevent degradation of demodulation characteristics.

When the tuner DSP 10 has a signal meter 24 for outputting a signal meter (S-meter) signal which indicates an intensity of the IF signal and the sound quality corrector 18 corrects the sound quality of a demodulated signal based on the signal meter signal, for example, the frequency selection characteristic related to the operation of the tuner DSP 10 is a frequency characteristic of a signal meter detector BPF 26 for allowing only a signal of a predetermined frequency band in the IF signal to pass.

The signal meter 24 detects the intensity of a carrier of the IF signal and outputs a signal meter signal based on the intensity. An S-meter-BPF 26 having a center frequency which is equal to the frequency of the IF signal carrier for extracting the carrier from the IF signal is provided upstream of the signal meter 24.

When the carrier frequency of the IF signal varies, the S-meter-BPF 26 receives an IF variation signal and the center frequency of the S-meter-BPF 26 is changed based on the amount of frequency variation.

With this structure, even when a carrier frequency of the IF signal varies, the extraction characteristic for the carrier of the IF signal in the S-meter-BPF 26 is not degraded, and thus, it is possible to prevent degradation of detection precision of the S-meter and to apply suitable sound quality correction based on the intensity of a received broadcast wave.

In the above description, the tuner DSP 10 is described as an AM receiver circuit. The present invention, however, is not limited to such a configuration, and may alternatively be applied to an FM receiver circuit. In an FM signal, a change proportional to the amplitude of a modulating signal is superposed on the frequency of the carrier of the IF signal. Thus, in an FM receiver circuit, when the carrier frequency of the IF signal varies, it is possible to correct operations of a signal processing circuit by controlling characteristics of an IF-BPF. Therefore, the only difference between the present invention realized in an FM receiver circuit and the present invention realized in an AM receiver circuit is that, in an FM receiver circuit, the IF variation signal detected by the frequency variation detector 40 is output only to the IF-BPF 14. When the carrier frequency of the FM-IF signal varies, the IF-BPF 14 receives the IF variation signal and the center frequency of the IF-BPF is controlled based on the amount of IF variation. The control may be applied in proportion to the IF variation signal or may be realized by providing, in advance, a plurality of BPFs having different characteristics and switching between the plurality of BPFs.

A signal processing circuit for a tuner according to the present invention has been described exemplifying a tuner DSP. The present invention, however, is not limited to a tuner DSP, and the structure of the present invention may be applied to any tuner system.

What is claimed is:

1. A signal processing circuit for a tuner which receives an input of an intermediate frequency signal produced by mixing a received broadcast signal and a local oscillator frequency signal produced by a first local oscillator and detects and demodulates the intermediate frequency signal, the signal processing circuit comprising:

a signal detector, operating based on a clock signal produced by a second local oscillator, for detecting the intermediate frequency signal; and a frequency variation detector for detecting a difference in frequency between a carrier of the intermediate frequency signal and the clock signal and for outputting an intermediate frequency variation signal, wherein the frequency variation detector comprises:

a detector band pass filter for extracting a carrier of the intermediate frequency signal;

a frequency counter for counting, based on the clock signal, a frequency of the carrier of the intermediate frequency signal which passes through the detector band pass filter; and an intermediate frequency variation signal outputting section for outputting the intermediate frequency variation signal based on a difference between the counted frequency and a frequency of the clock signal, and a frequency selection characteristic in operation of the signal processing circuit for a tuner is controlled based on the intermediate frequency variation signal.

2. A signal processing circuit for a tuner according to claim 1, further comprising:

a signal meter for outputting a signal meter signal based on the input intermediate frequency signal; and a sound quality corrector for correcting sound quality of a demodulated signal based on the signal meter signal, wherein the signal meter has a signal meter detector band pass filter which allows only a signal within a predetermined frequency band among the intermediate frequency signal to pass, and a center frequency of the signal meter detector band pass filter is controlled based on the intermediate frequency variation signal.

3. A signal processing circuit for a tuner according to claim 1, wherein the signal detector is a synchronous detector which uses a phase-locked loop, and a characteristic of a loop filter of the phase-locked loop is controlled based on the intermediate frequency variation signal.

4. A signal processing circuit for a tuner according to claim 3, further comprising:

a signal meter for outputting a signal meter signal based on the input intermediate frequency signal; and a sound quality corrector for correcting sound quality of a demodulated signal based on the signal meter signal, wherein the signal meter has a signal meter detector band pass filter which allows only a signal within a predetermined frequency band among the intermediate frequency signal to pass, and a center frequency of the signal meter detector band pass filter is controlled based on the intermediate frequency variation signal.

5. A signal processing circuit for a tuner according to claim 1, further comprising:

an intermediate frequency signal band pass filter for allowing only a signal within a predetermined frequency band among the input intermediate frequency signal to pass and for outputting to the signal detector, wherein a center frequency or a frequency bandwidth of the intermediate frequency signal band pass filter is controlled based on the intermediate frequency variation signal.

6. A signal processing circuit for a tuner according to claim 5, further comprising:

a signal meter for outputting a signal meter signal based on the input intermediate frequency signal, and a sound quality corrector for correcting sound quality of a demodulated signal based on the signal meter signal, wherein the signal meter has a signal meter detector band pass filter which allows only a signal within a predetermined frequency band among the intermediate frequency signal to pass, and a center frequency of the signal meter detector band pass filter is controlled based on the intermediate frequency variation signal.

7. A signal processing circuit for a tuner according to claim 5, wherein the signal detector is a synchronous detector which uses a phase-locked loop, and a characteristic of a loop filter of the phase-locked loop is controlled based on the intermediate frequency variation signal.

8. A signal processing circuit for a tuner according to claim 7, further comprising:

a signal meter for outputting a signal meter signal based on the input intermediate frequency signal; and a sound quality corrector for correcting sound quality of a demodulated signal based on the signal meter signal, wherein the signal meter has a signal meter detector band pass filter which allows only a signal within a predetermined frequency band among the intermediate frequency signal to pass, and a center frequency of the signal meter detector band pass filter is controlled based on the intermediate frequency variation signal.

9. A signal processing circuit for a tuner according to claim 5, further comprising:

an adjacent interference detector for detecting adjacent interference from the input intermediate frequency signal, wherein a center frequency or a frequency bandwidth of the intermediate frequency signal band pass filter is controlled based on the detected adjacent interference information, and a detection frequency range of the adjacent interference detector is controlled based on the intermediate frequency variation signal.

10. A signal processing circuit for a tuner according to claim 9, further comprising:

a signal meter for outputting a signal meter signal based on the input intermediate frequency signal; and a sound quality corrector for correcting sound quality of a demodulated signal based on the signal meter signal, wherein the signal meter has a signal meter detector band pass filter which allows only a signal within a predetermined frequency band among the intermediate frequency signal to pass, and a center frequency of the signal meter detector band pass filter is controlled based on the intermediate frequency variation signal.

11. A signal processing circuit for a tuner according to claim 9, wherein the signal detector is a synchronous detector which uses a phase-locked loop, and a characteristic of a loop filter of the phase-locked loop is controlled based on the intermediate frequency variation signal.

12. A signal processing circuit for tuner according to claim 11, further comprising:

a signal meter for outputting a signal meter signal based on the input intermediate frequency signal; and a sound quality corrector for correcting sound quality of a demodulated signal based on the signal meter signal, wherein the signal meter has a signal meter detector band pass filter which allows only a signal within a predetermined frequency band among the intermediate frequency signal to pass, and a center frequency of the signal meter detector band pass filter is controlled based on the intermediate frequency variation signal.

* * * * *